United States Patent [19]

Jones

[11] Patent Number: 5,068,567
[45] Date of Patent: Nov. 26, 1991

[54] APPARATUS FOR INCREASING THE RECOVERABLE ENERGY OF A PIEZOELECTRIC BENDER

[75] Inventor: Donald W. Jones, Burnt Hills, N.Y.

[73] Assignee: General Electric Company, Schenectady, N.Y.

[21] Appl. No.: 603,647

[22] Filed: Oct. 26, 1990

[51] Int. Cl.$^5$ ............................................. H01L 41/08
[52] U.S. Cl. ..................................... 310/332; 310/330
[58] Field of Search ................................. 310/330–332, 310/348

[56] References Cited

U.S. PATENT DOCUMENTS

| | | | |
|---|---|---|---|
| 2,352,311 | 6/1944 | Toro | 310/332 |
| 3,949,247 | 4/1976 | Fenner et al. | 310/332 |
| 4,093,883 | 6/1978 | Yamamoto | 310/332 X |
| 4,492,360 | 1/1985 | Lee et al. | 310/330 |
| 4,564,851 | 1/1986 | Nilsson et al. | 310/330 X |

FOREIGN PATENT DOCUMENTS

| | | | |
|---|---|---|---|
| 970817 | 7/1975 | Canada | 310/332 |
| 0153527 | 11/1981 | Japan | 310/332 |
| 0103184 | 6/1983 | Japan | 310/332 |
| 0062170 | 4/1985 | Japan | 310/332 |
| 0168971 | 7/1986 | Japan | 310/332 |
| 0089370 | 4/1987 | Japan | 310/332 |
| 0089371 | 4/1987 | Japan | 310/332 |
| 0237780 | 10/1987 | Japan | 310/332 |

OTHER PUBLICATIONS

*IBM Technical Disclosure Bulletin*, Tapered Surface Piezo Actuator, by Smith, vol. 27, No. 6, Nov. 1984, p. 3568.

*Primary Examiner*—Mark O. Budd
*Attorney, Agent, or Firm*—Jill M. Breedlove; James C. Davis, Jr.; Marvin Snyder

[57] ABSTRACT

A cantilever-mounted piezoelectric bender includes apparatus for forcing the bender to approach straightness when in a blocked position, e.g. when meeting a contact in an electrical relay. As a result, the potential energy recoverable from the bender is maximized without requiring additional piezoelectric material. A first preferred embodiment comprises a bender extension mounted on the free end of the bender. A normal load force is applied to the free end of the extension, rather than the free end of the bender, resulting in the application of a moment to the end of the bender which tends to straighten the bender when in a blocked position. A second preferred embodiment comprises a back-up plate disposed adjacent one surface of the bender. The degree to which the bender is straightened in a blocked position depends on the location of the point of tangency between the back-up plate and the extension.

5 Claims, 7 Drawing Sheets

APPARATUS FOR INCREASING THE RECOVERABLE ENERGY OF A PIEZOELECTRIC BENDER

FIELD OF THE INVENTION

The present invention relates generally to piezoelectric benders and, more particularly, to apparatus for decreasing the curvature of a piezoelectric bender, thereby increasing the amount of potential energy recoverable therefrom.

BACKGROUND OF THE INVENTION

A piezoelectric flexure element, or bender, generally comprises two relatively thin strips of piezoelectric material either bonded together or with a metal strip therebetween. The bender is typically mounted in a cantilever fashion. Electrodes comprising, for example, metal coatings are disposed on the outer surfaces of the piezoelectric strips. Furthermore, the strips are oppositely polarized so that the application of a voltage between the electrodes causes one of the strips to expand lengthwise while the other one contracts. As a result, the piezoelectric flexure element bends, and the free end thereof is displaced a distance which depends on the degree of bending and, in turn, on the applied voltage. Such piezoelectric benders are useful in, for example, electrical relays and switches.

The most costly part of a piezoelectric bender is the piezoelectric material employed therein. For this reason, the bender material should be used at maximum efficiency. In a piezoelectric relay, for example, the product of bender force and distance moved by the free end is energy. Ideally, the maximum energy from an activated bender is recovered by forcing the bender to be straight when it is in a "blocked" position; i.e. the free end of the bender is prevented from moving freely when a normal force is applied thereto, as, for example, when a contact on the free end of a bender meets another contact in an electrical relay. Typically, however, when a force is applied to a bender by simple cantilever loading, there is a significant curvature of the bender when blocked, which curvature represents unrecovered potential energy.

OBJECTS OF THE INVENTION

Accordingly, it is an object of the present invention to provide means for increasing the utilization of the potential energy of an energized piezoelectric bender by forcing the bender to approach straightness in a fully or partially blocked position.

Another object of the present invention is to provide simple means for maximizing the potential energy of an energized piezoelectric bender without requiring additional piezoelectric material.

SUMMARY OF THE INVENTION

The foregoing and other objects are achieved in a cantilever-mounted piezoelectric bender including apparatus for forcing the bender to approach straightness when in a blocked position. As a result, the potential energy recoverable from the bender is maximized without requiring additional piezoelectric material. A first preferred embodiment of the piezoelectric bender of the present invention comprises a bender extension mounted on the free end of the bender. The bender extension preferably has a stiffness substantially equal to or greater than that of the piezoelectric material comprising the bender. A suitable bender extension may be comprised of, for example, a plastic. According to the present invention, the normal load force is applied to the free end of the extension, rather than the free end of the bender, resulting in the application of a moment to the end of the bender which tends to straighten the bender when in a blocked position.

A second preferred embodiment of the present invention comprises a back-up plate disposed adjacent to one surface of the bender. The degree to which the bender is straightened in a blocked position depends on the location of the point of tangency between the back-up plate and the extension.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1A:
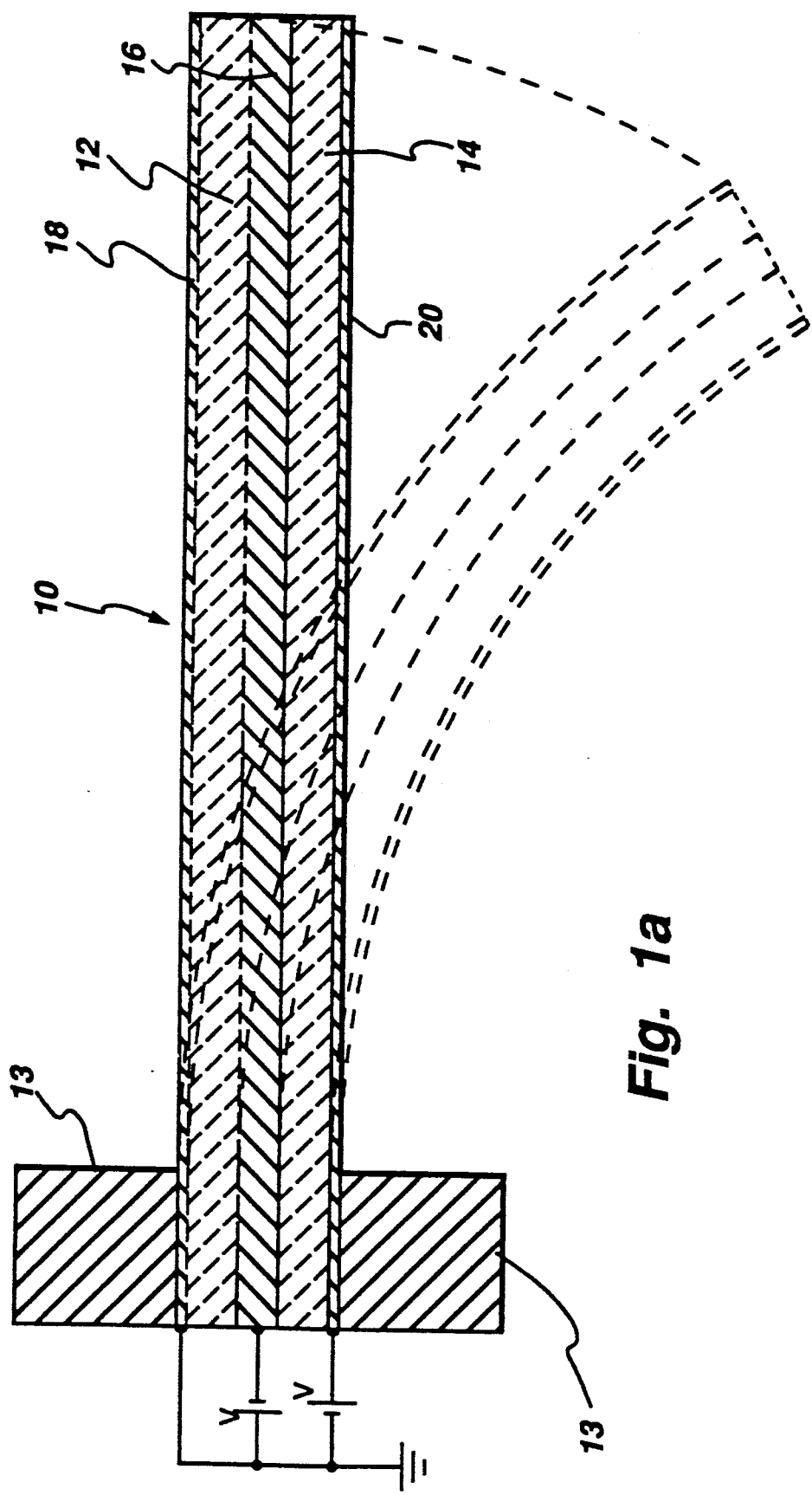
FIG. 1a illustrates a typical cantilever-mounted piezoelectric bender.
Figure 1B:
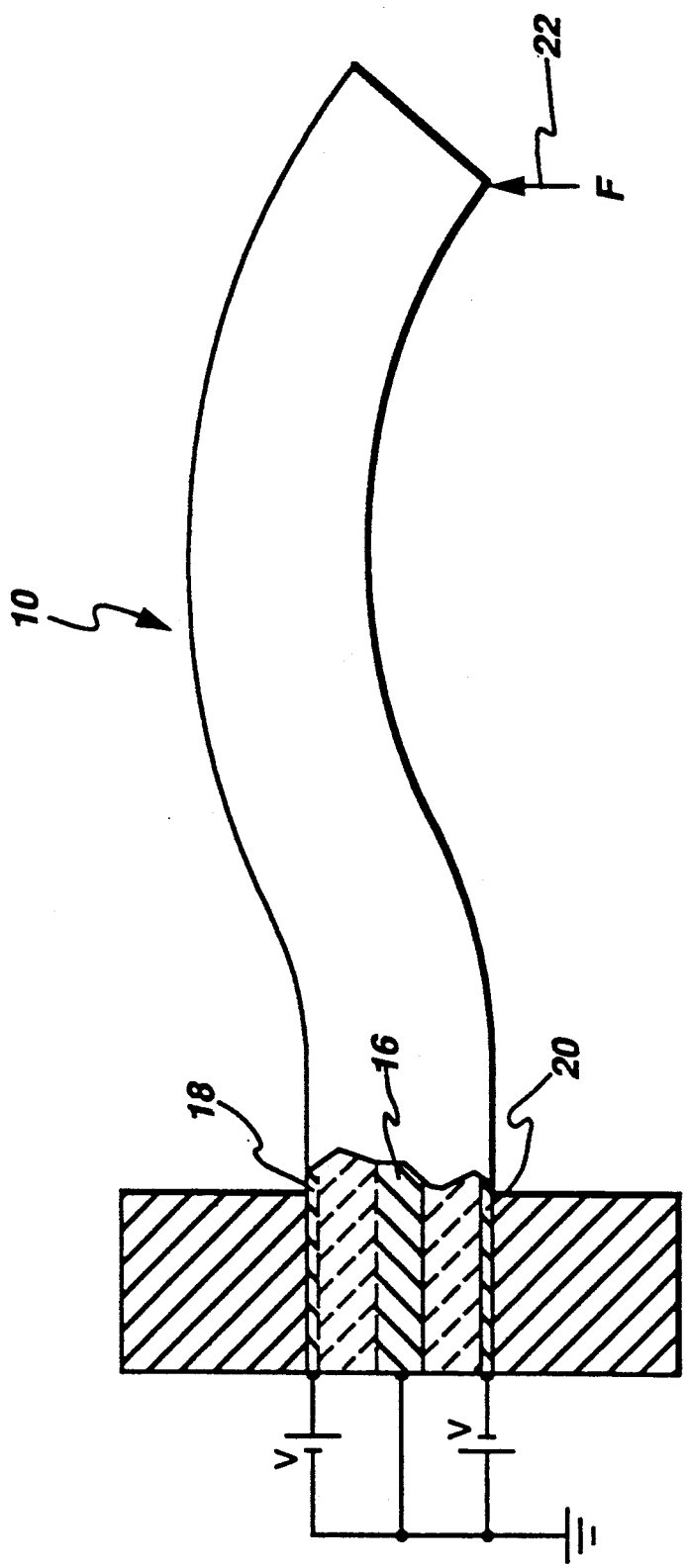
FIG. 1b illustrates the bender of FIG. 1a in a blocked position.

FIG. 1a shows a typical cantilever-mounted piezoelectric bender 10 including piezoelectric strips 12 and 14 with a central metal strip comprising an electrode 16 situated therebetween. Clamps 13 are employed for mounting bender 10 in a cantilever fashion as shown. The piezoelectric strips are comprised of any suitable piezoelectric material, such a piezoelectric ceramic. The outer surface of each piezoelectric strip respectively has a conductive coating disposed thereon in order to form electrodes 18 and 20, respectively. As shown in FIG. 1a, electrode 18 is coupled to ground, and a voltage $-V$ is applied between central electrode 16 and ground, while a voltage $+V$ is applied between electrode 20 and ground. (Alternatively, as shown in FIG. 1b, electrode 16 may be coupled to ground, with a voltage $+V$ applied to electrode 18 and a voltage $-V$ applied to electrode 20. Still another alternative, not shown, involves coupling a voltage $+V$ between each electrode 18 and 20 and ground, with electrode 16 also coupled to ground.) As a result, bender 10 bends downwardly, displacing the free end thereof as shown, greatly exaggerated, in phantom in FIG. 1a. Alternatively, if voltages of opposite polarity were applied to electrodes 18 and 20, respectively, bender 10 would bend upwardly.

FIG. 1b shows the piezoelectric bender of FIG. 1a in a blocked position. In particular, a normal force F is applied to the end of energized bender 10 by a contact 22. The bender is thereby prevented from deflecting freely. As a result, bender 10 curves significantly, with the curvature of bender 10 representing unrecovered potential energy.

Figure 2:
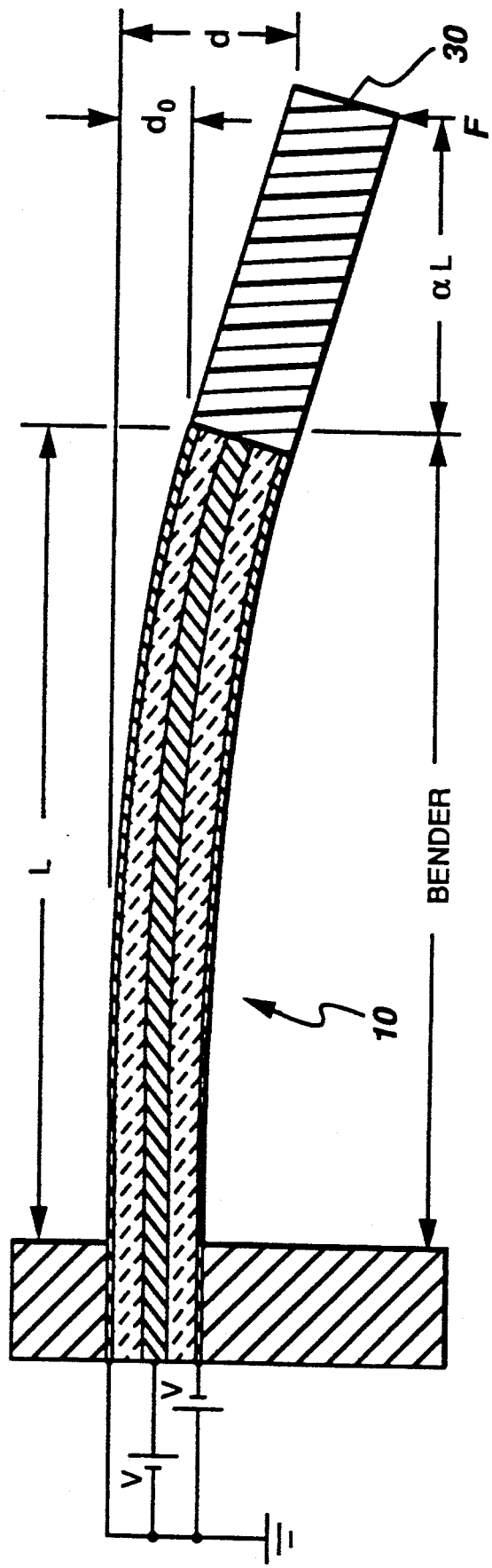
FIG. 2 shows a piezoelectric bender employing a bender extension in accordance with the present invention.

In accordance with the present invention, a piezoelectric bender includes means for forcing the bender to approach straightness in a fully or partially blocked position. In this way, the efficiency of the piezoelectric bender is maximized. A preferred embodiment is illustrated in FIG. 2 wherein cantilever-mounted piezoelectric bender 10 includes a bender extension 30. Bender extension 30 and bender 10 should be of comparable stiffness. The ratio K of extension stiffness to bender stiffness is given by the following expression:

$$K = \frac{(EI)_{extension}}{(EI)_{bender}},$$

where K is the ratio of extension stiffness to bender stiffness, E represents Young's Modulus, I represents Moment of Inertia, and the product (EI) represents stiffness. A preferred value of stiffness ratio K is 1.0. A suitable extension may comprise, for example, a plastic.

With a normal force F applied to the end of bender extension 30, rather than the end of the bender as in the conventional loading scheme described hereinabove, a moment M is applied to the bender in such a direction as to oppose the curvature which would otherwise exist without the extension. The effect of the bender extension, therefore, is to force the bender to approach straightness in a blocked position. Efficiency of the bender is thus maximized.

In FIG. 2: L represents the length of bender 10; $\alpha$L represents the length of bender extension 30 as a fraction $\alpha$ of the bender length; $d_0$ represents the free deflection of the bender without the extension; d represents the free deflection of the bender with the extension; and F represents the normal force on the bender with the extension in the blocked position.

Figure 3:
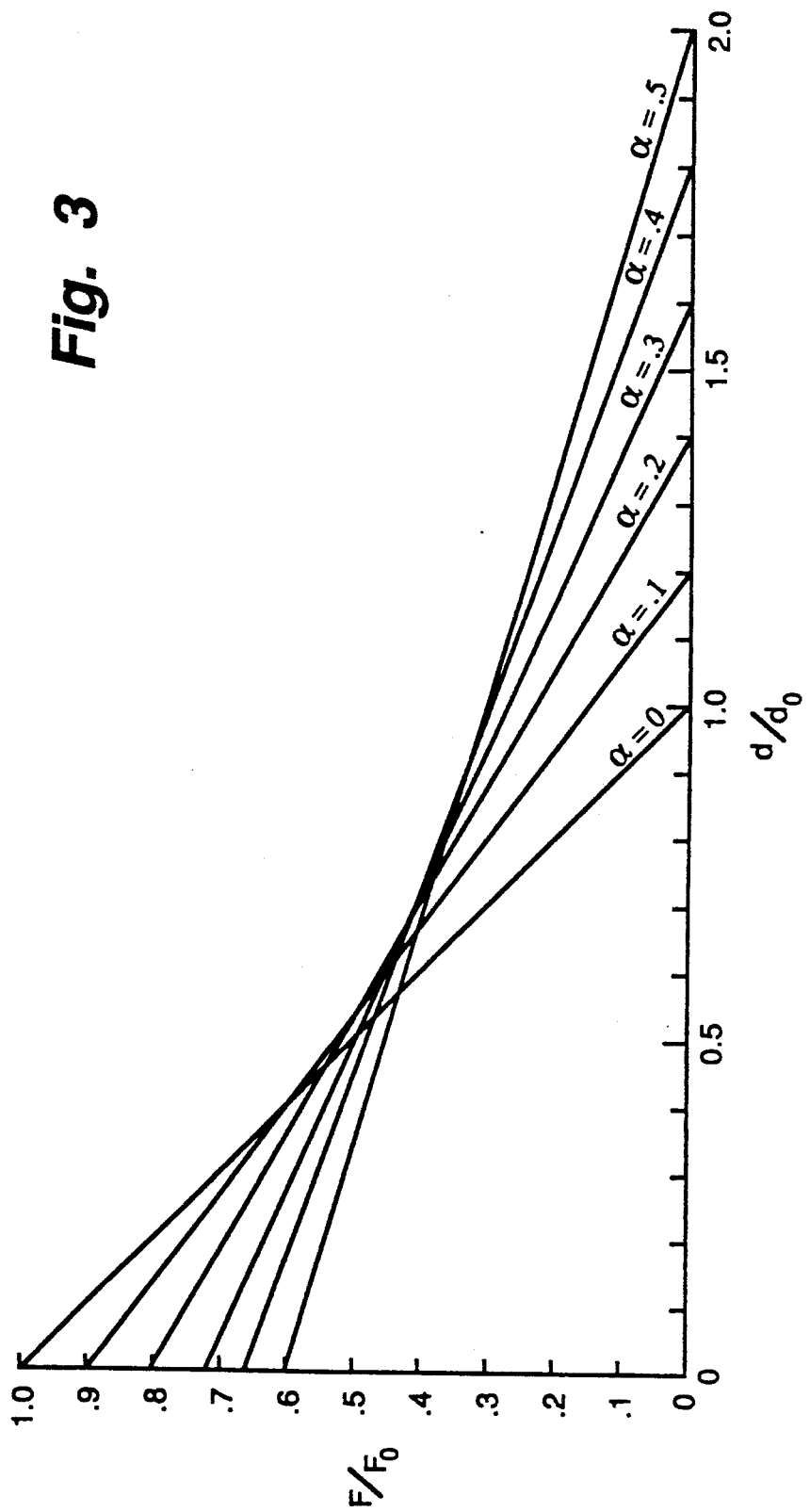
FIG. 3 graphically illustrates the effect of bender extension length on the performance of the bender.
Figure 4:
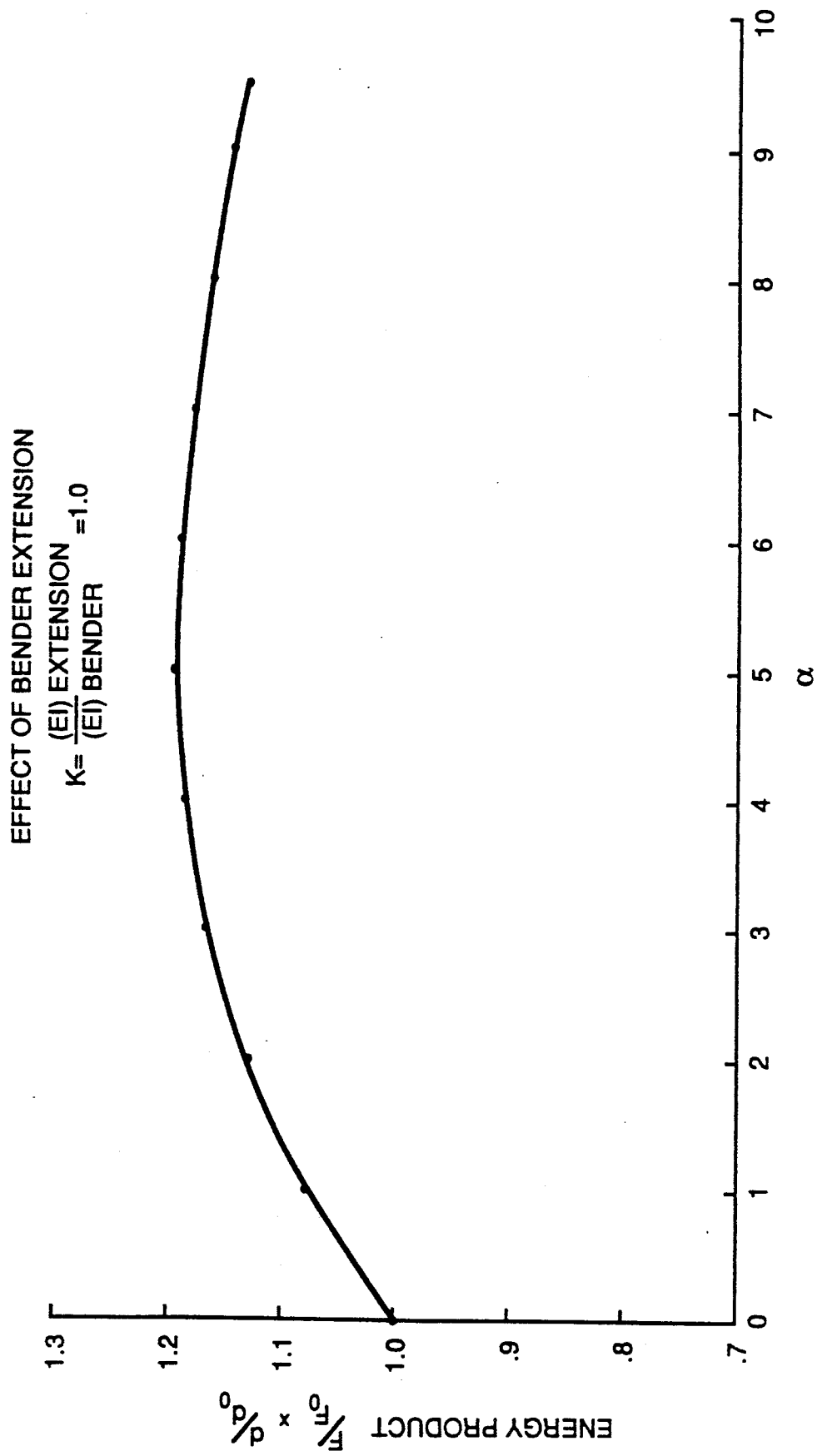
FIG. 4 graphically illustrates normalized energy-product versus fractional length extension for a bender and extension of equal stiffness.

FIG. 3 graphically illustrates normalized force F/F0 versus normalized free deflection d/d0 for different values of the fractional length extension $\alpha$ wherein:

$$\frac{F}{F_0} = \frac{1 + 2\alpha}{1 + 3\alpha + 3\alpha^2 + \frac{\alpha^3}{K}}, \text{ and}$$

$$\frac{d}{d_0} = 1 + 2\alpha,$$

where F0 represents the normal force on the bender without the extension in the blocked position, and K represents the ratio of extension stiffness to bender stiffness and is given by:

$$K = \frac{(EI)_{extension}}{(EI)_{bender}},$$

as stated hereinabove. From FIG. 3, it is apparent that as the applied force decreases, the amount of free deflection increases for increasing extension length. Hence, the energy recoverable from a blocked bender, with an extension, increases with increasing extension length. Furthermore, it has been found that there is an optimum range of bender extension lengths for maximizing the recoverable energy. FIG. 4 graphically illustrates the normalized energy product (F/F0·d/d0) versus the fractional length extension $\alpha$ for a bender and extension of equal Stiffness, i.e. K = 1.0. As shown in the graph of FIG. 4, the energy product is increased by about 18% for a fractional length extension of $0.4 \leq \alpha \leq 0.6$.

Figure 5:
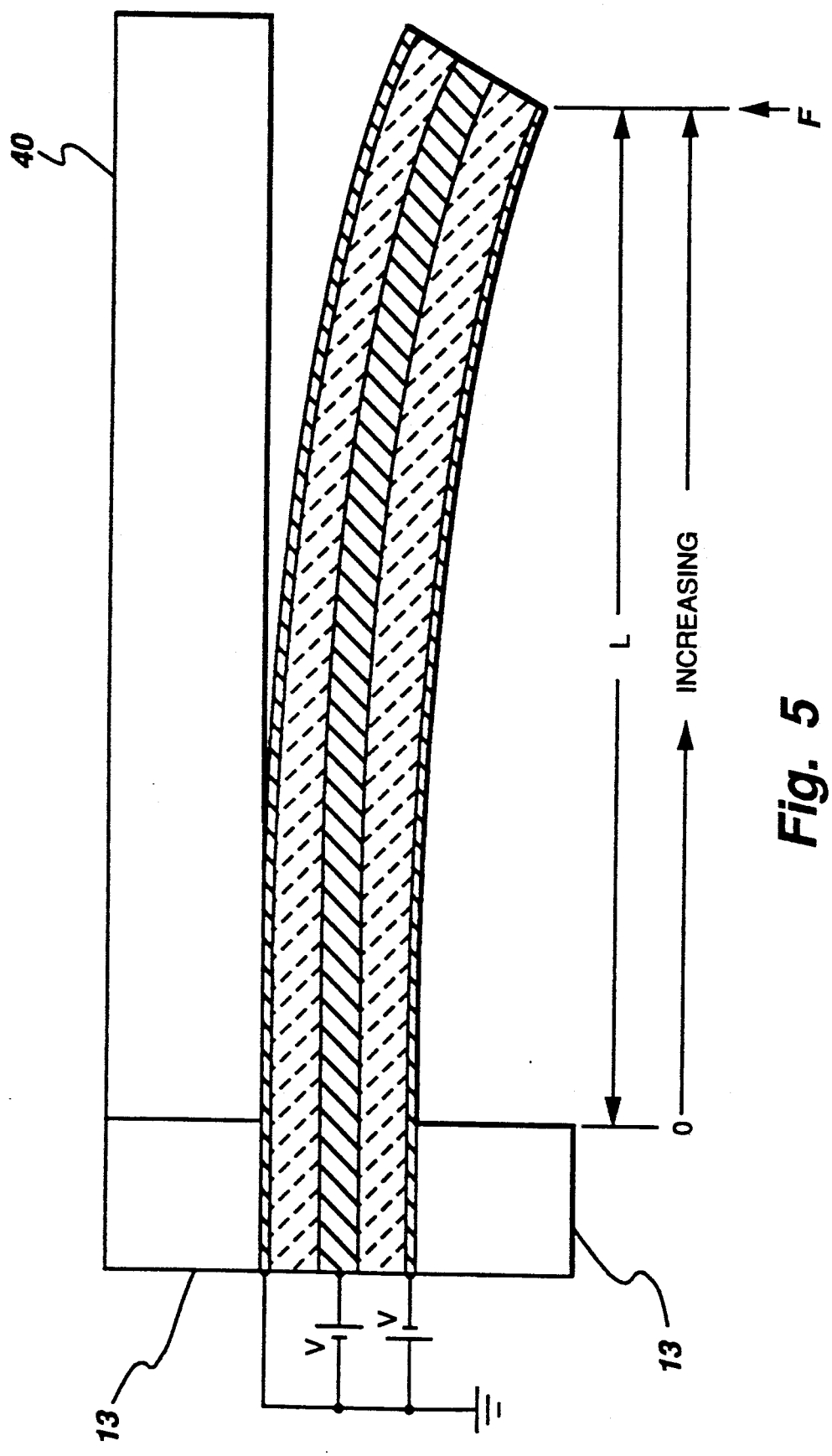
FIG. 5 shows a piezoelectric bender employing a back-up plate in accordance with the present invention.

A second preferred embodiment of the piezoelectric bender of the present invention, i.e. including means for forcing the bender to approach straightness in a blocked position, is shown in FIG. 5. In particular, the embodiment of FIG. 5 includes a back-up plate 40 for forcing bender 10 to approach a substantially straight position when fully blocked, thereby maximizing the recoverable potential energy therefrom. With the back-up plate positioned as shown in FIG. 5, motion of the bender is restricted to one direction only, i.e. downward. On the other hand, if upward motion of the bender of FIG. 5 were desired, the back-up plate could be positioned proximate electrode 20. In either case, such a back-up plate could be comprised of an insulator, such as plastic, or have a coating comprised of an insulating material disposed thereon in order to insulate the back-up plate from electrode 18. Alternatively, back-up plate 40 could be comprised of a conductive material which is at the same potential as the electrode proximate thereto.

Figure 6:
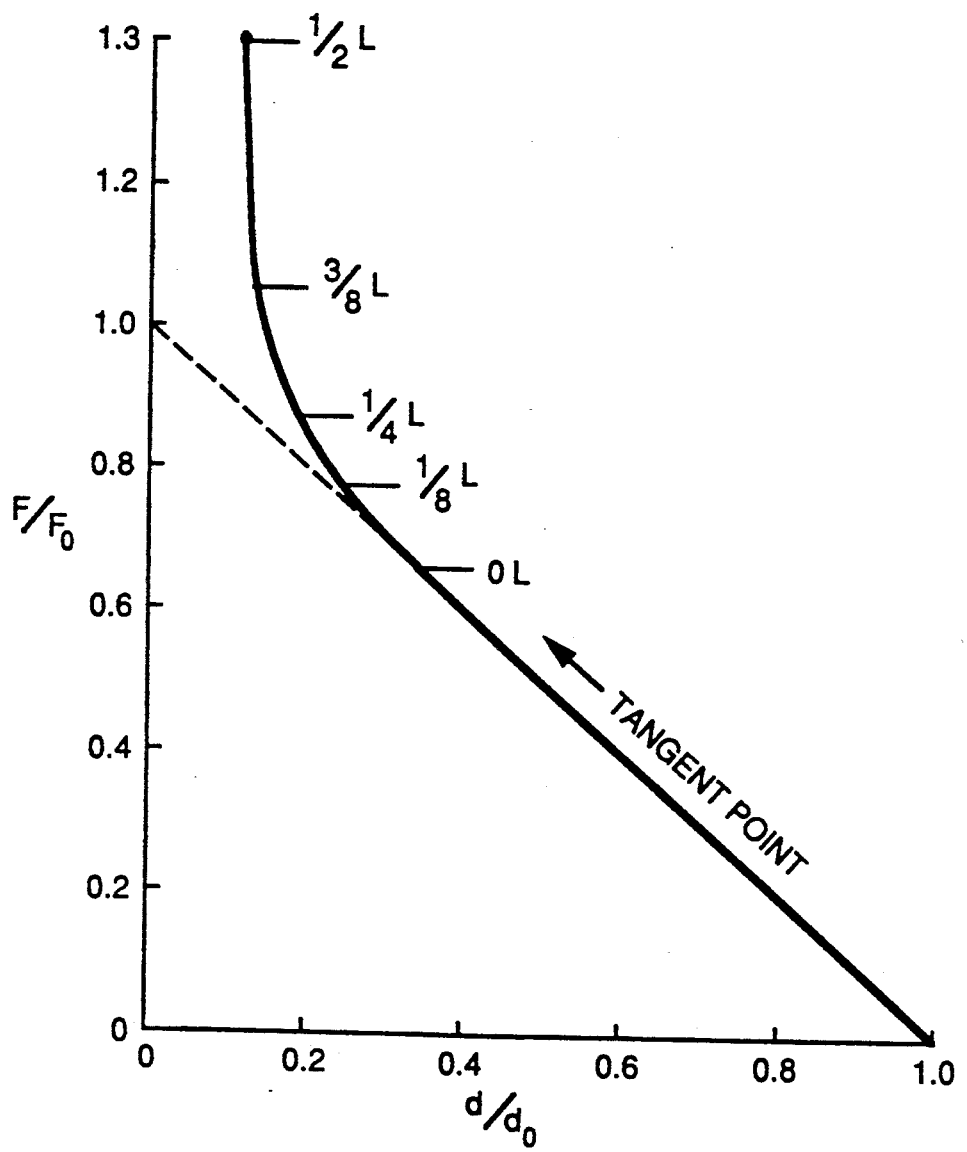
FIG. 6 graphically illustrates normalized force versus normalize deflection for the bender of FIG. 5.

FIG. 6 graphically illustrates normalized force F/F0 versus normalized free deflection d/d0 for a piezoelectric bender without a back-up plate (the dashed line), such as that of FIG. 1, and a bender with a back-up plate (the solid, curved line), such as that of FIG. 5. In FIG. 6, specific tangency points between back-up plate 40 and bender 10 are labelled for purposes of comparison. The labelled tangency points are 0, ¼L, ½L, ¾L, and ⅞L. Since the area under each curve at each respective point thereon represents the normalized energy product (F/F0·d/d0) at that point, it is apparent that as the point of tangency moves a greater distance along the bender, the amount of recoverable energy increases with respect to that of a bender without a back-up plate. Furthermore, it is to be understood that once the desired tangency point is chosen, the back-up plate may be constructed to extend only up to that point, if desired, as the additional length beyond the point of tangency would not add to the recoverable energy.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A piezoelectric bender, comprising:
 a cantilever-mounted piezoelectric core portion having two oppositely polarized strips of piezoelectric material, said piezoelectric core portion having a free end and a fixed end;
 at least two electrodes, one of said electrodes disposed on either outer surface of said core portion, said piezoelectric core portion bending in a predetermined direction when a voltage signal is applied between said electrodes; and
 a bender extension, having a length in the range from approximately 40% to 60% of the length of said piezoelectric core portion and being substantially as stiff as said piezoelectric core portion, coupled to the free end of said piezoelectric core portion for minimizing the curvature of said piezoelectric bender when said bender is energized and thereby maximizing the potential energy recoverable therefrom.

2. A piezoelectric bender, comprising:
a cantilever-mounted piezoelectric core portion having two oppositely polarized strips of piezoelectric material, said piezoelectric core portion having a free end and a fixed end;
at least two electrodes, one of said electrodes disposed on either outer surface of said core portion, said piezoelectric core portion bending in a predetermined direction when a voltage signal is applied between said electrodes; and
a flat back-up plate disposed adjacent, but unattached, to the outer surface of said piezoelectric core portion which is opposite to the direction of displacement of said bender, said back-up plate being positioned so as to minimize the curvature of said piezoelectric bender when said bender is energized to apply a force at the free end thereof in said predetermined direction away from said back-up plate, thereby maximizing the potential energy recoverable therefrom, the length of said back-up plate extending from a point adjacent to said fixed end of said piezoelectric core portion to a point a predetermined distance from said fixed end.

3. The piezoelectric bender of claim 2 wherein said back-up plate is comprised of an insulating material.

4. The piezoelectric bender of claim 2 wherein said back-up plate is coated with an insulating material.

5. The piezoelectric bender of claim 2 wherein said back-up plate is comprised of a conductive material at the same potential as the corresponding one of said electrodes proximate thereto.

* * * * *